United States Patent [19]
Miles et al.

[11] Patent Number: 5,535,101
[45] Date of Patent: Jul. 9, 1996

[54] LEADLESS INTEGRATED CIRCUIT PACKAGE

[75] Inventors: Barry M. Miles, Plantation; Frank J. Juskey, Coral Springs; Kingshuk Banerji, Plantation, all of Fla.

[73] Assignee: Motorola, Inc., Schaumburg, Ill.

[21] Appl. No.: 970,901

[22] Filed: Nov. 3, 1992

[51] Int. Cl.$^6$ ................................. H05K 7/10
[52] U.S. Cl. ............... 367/808; 361/760; 361/771; 361/807; 257/686; 257/787; 174/52.4; 174/260
[58] Field of Search .................... 361/380, 388, 361/396, 397, 400–403, 411, 417, 418, 419, 420; 174/52.2, 52.1, 52.3, 52.4, 55, 259, 260, 262, 263; 257/686, 778, 774, 787, 758, 783, 787, 790; 219/121.71, 121.16, 121.65, 121.66, 121.70; 428/116, 224, 226, 229

[56] References Cited

U.S. PATENT DOCUMENTS

| | | | |
|---|---|---|---|
| 4,604,644 | 8/1986 | Beckham et al. | 357/80 |
| 4,864,470 | 9/1989 | Nishio | 361/400 |
| 4,931,345 | 6/1990 | Böttger et al. | 428/116 |
| 5,107,325 | 4/1992 | Nakayoshi | 357/69 |
| 5,172,303 | 12/1992 | Bernardoni et al. | 361/396 |
| 5,241,133 | 8/1993 | Mullen, III et al. | 174/52.4 |
| 5,378,869 | 1/1995 | Marrs et al. | 219/121.71 |

FOREIGN PATENT DOCUMENTS 61-27667  2/1986  Japan.
2128453  5/1990  Japan.

*Primary Examiner*—Leo P. Picard
*Assistant Examiner*—Y. Whang
*Attorney, Agent, or Firm*—Dale W. Dorinski

[57] ABSTRACT

A semiconductor device package comprises an integrated circuit chip (10), a substrate (16), an encapsulant (30), and an organic coupling agent or underfill material (12) disposed between the integrated circuit chip and the first side of the substrate. The chip has a plurality of interconnection pads (14) disposed on an active surface of the chip at some minimum spacing "X." Each of the interconnect pads also has electrically conducting bumps (26) on them. The substrate has a circuit pattern (20) on a first side and an array of solder pads (23) spaced a certain distance apart on an opposite side of the substrate. The distance between these pads is greater than the minimum distance (X) between the interconnect pads on the IC. The circuit pattern is electrically connected to the array of solder pads by plated through holes (22). The length and width of the circuit carrying substrate is substantially greater than the length and width of the integrated circuit chip. The chip is mounted face down to the substrate with the electrically connecting bumps, such that at least some of the plated through holes in the substrate are covered by the chip. The polymeric encapsulant (30) covers the entire chip and substantially all of the first side of the substrate, providing a sealed package.

8 Claims, 2 Drawing Sheets

LEADLESS INTEGRATED CIRCUIT PACKAGE

CROSS REFERENCE TO RELATED APPLICATIONS

This application is related to U.S. application Ser. No. 07/898,231, filed Jun. 12, 1992, entitled "Integrated Circuit Chip Carrier", by Thompson, et al., assigned to Motorola, Inc., which is a continuation of application Ser. No. 07/704,471, filed May 23, 1991, also assigned to Motorola, Inc. and now abandoned.

TECHNICAL FIELD

This invention relates in general to the field of integrated circuits and most particularly to an encapsulated chip carrier for integrated circuits.

BACKGROUND

The demand for manufacturing electrical assemblies with greater densities and smaller package size requires techniques to efficiently utilize the available area on a printed circuit board. One such technique is to directly bond the integrated circuit chip to the corresponding contact points on the printed circuit board, thereby eliminating the necessity of using a chip carrier with a conventional ceramic or plastic cover or encapsulating the integrated circuit chip. The most popular method of directly bonding a chip to a circuit board is known as chip-on-board (COB). In chip-on-board, the integrated circuit (IC) is mounted directly on the circuit board and is either wirebonded to the board or attached using TAB technology. These techniques have been widely used in the manufacture of watches and other small electronic products. However, the IC is brittle and fragile and is subject to stress and breakage if the circuit board is bent, vibrated, or exposed to wide variations in the operating environment. Accordingly, in many applications, such as two-way radios and other portable communication devices where the assembly is subject to vibration and severe environmental disturbances, direct connections between the IC and the circuit board are not desirable.

Conventional techniques for protecting and packaging the IC provide a buffer substrate between the IC and the circuit board, thereby reducing or eliminating the stress imparted to the chip during mechanical and thermal excursions. Conventional ceramic and plastic leadless chip carriers fall into this category. The buffer substrate also enables one to utilize simpler, lower cost circuit boards without the need for high density lines and spaces.

In COB technology, the IC is attached to the substrate by means of control-collapse-chip-connection (also known as C4). In order to achieve high yields and reliability in making a C4 connection, a cleanroom environment must be utilized. One can easily see that the C4 process is not suitable for normal manufacturing facilities where components are mounted on the circuit boards.

In addition, as the number of input and output connections (I/O) on the IC increases, the size of a buffer substrate required to interconnect the IC to the circuit board also increases. In those applications where it is necessary to minimize the height of the chip carrier package, very thin buffer substrates are used. The creates another problem; namely, the buffer substrate can now be easily warped, bent, or bowed, creating numerous problems when attempting to assemble the chip carrier package to the circuit board. Conventional attempts to rigidize the substrate involve using more expensive :substrates and/or using thicker substrates, neither of which is a desired solution. Thicker substrates defeat the purpose of creating a small, thin chip carder package and exotic laminates also thwart any attempts at creating low-cost packages.

Clearly, a need exists for an integrated circuit package that can solve the problems of mechanical and thermal excursions, reduced size, lower cost packages, provide chip carders that can be electrically tested prior to assembly to the main board, and that do not require a cleanroom environment for assembly of the package to the main circuit board.

SUMMARY OF THE INVENTION

Briefly, according to the invention, there is provided a semiconductor device package comprising an integrated circuit chip, a substrate, and an encapsulant. The chip has a plurality of interconnection pads disposed on an active surface of the chip at some minimum spacing "X." Each of the interconnect pads also has electrically conducting bumps on them. A circuit carrying substrate has a circuit pattern on a first side and an array of solder pads spaced a certain distance apart on an opposite side of the substrate. The distance between these pads is greater than the minimum distance (X) between the interconnect pads on the IC. The circuit pattern is electrically connected to the array of solder pads by means of plated through holes. The length and width of the circuit carrying substrate is substantially greater than the length and width of the integrated circuit chip. The chip is attached face down to the circuit pattern and the electrically connecting bumps are used to provide an electrical interconnection between the chip and the substrate. The chip is mounted to the substrate such that at least some of the plated through holes in the substrate are covered by the chip. A polymeric encapsulant now covers the entire chip and substantially all of the first side of the substrate, providing a sealed package.

In an alternate embodiment of the invention, an organic coupling agent or underfill material is disposed between the integrated circuit chip and the first side of the substrate and covers at least a portion of the active surface of the chip. In the preferred embodiment, the organic coupling agent is an epoxy.

DETAILED DESCRIPTION OF THE PREFERRED EMBODIMENT

Figure 1:
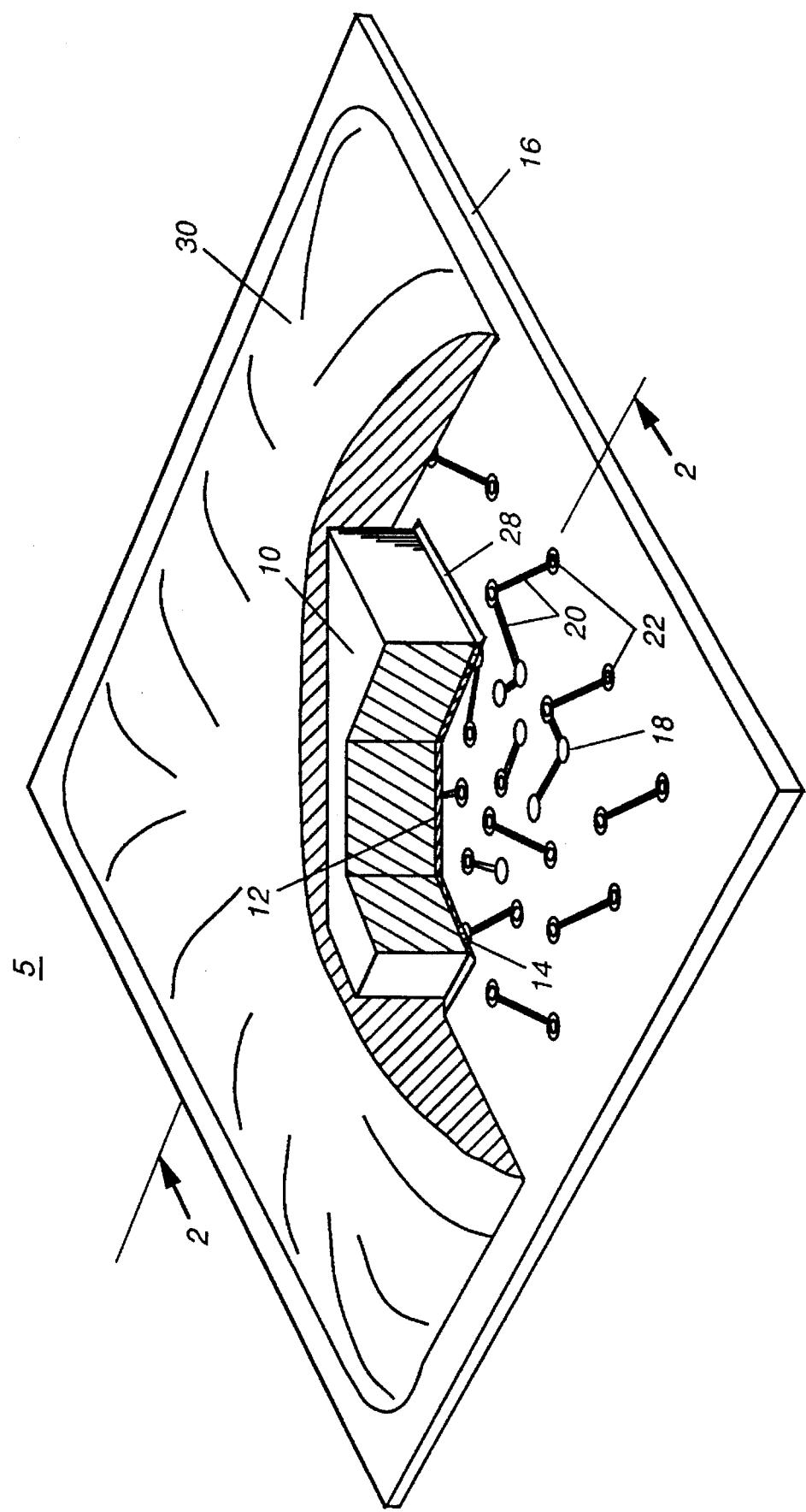
FIG. 1 is a cut-away, isometric view of a preferred embodiment in accordance with the invention.

While the specification concludes with claims defining the features of the invention that are regarded as novel, it is believed that the invention will be better understood from a consideration of the following description in conjunction with the drawing figures, where like reference numerals are carried forward.

Figure 2:
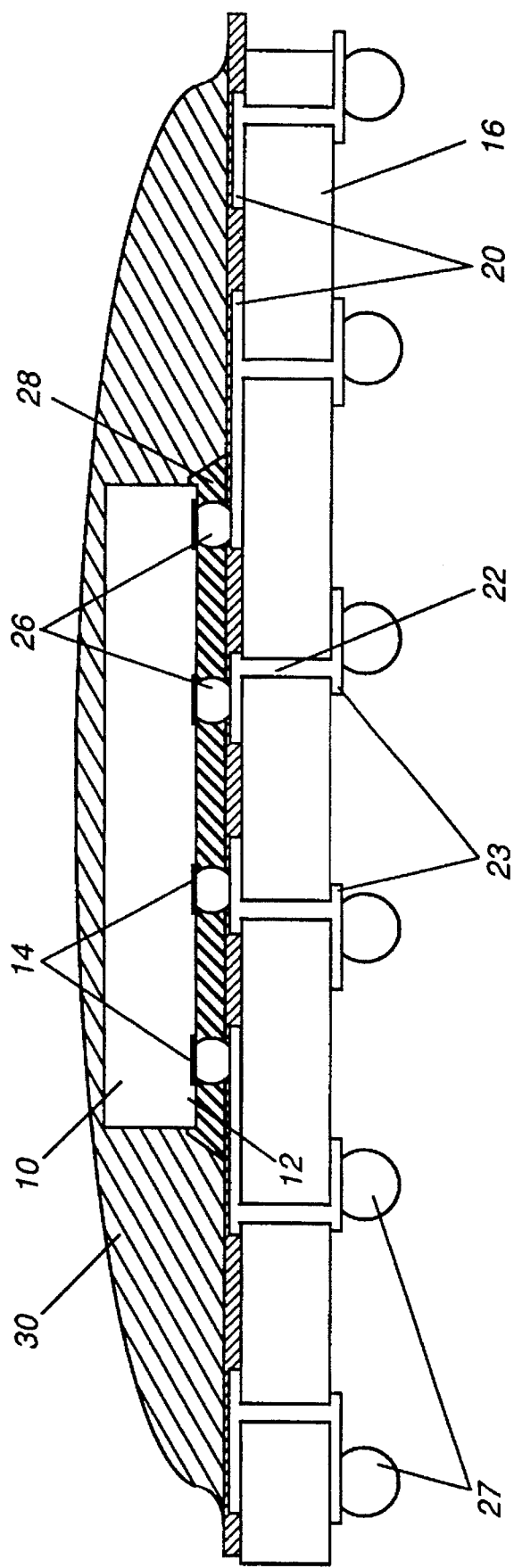
FIG. 2 is a cross-sectional view through section 2—2 of FIG. 1.

Referring now to FIGS. 1 and 2, an integrated circuit (IC) 10 contains an active surface 12 having interconnection pads 14 arranged in a configuration near the perimeter of the IC. In the preferred embodiment of the invention, the interconnect pads 14 are located near the perimeter but may also be located in the interior of the active surface or in an array on the active surface. A circuit carrying substrate 16 has an array of bonding pads 18 that correspond to the interconnect pads 14 on the IC. The circuit carrying substrate 16 is typically a printed circuit board made from low expansion coefficient materials (expansion coefficients between about 6 and about 18 in/in/° C.×10$^{-6}$). One example of a useful material is Thermount E215/CE laminate from the DuPont Corporation of Wilmington, Del. This laminate is reinforced with ARAMID® fibers. Other types of polymers, such as polyesters, polyamides, polyimides, and modifications or blends of these resins may also be employed in conjunction with reinforcing materials. Other types of suitable reinforcements are glass fibers or woven glass mat as is typically found in, for example, FR-4 laminates. In addition, the circuit carrying substrate 16 also contains other circuitry or circuit patterns 20 that interconnect the pads 18 to conductive through holes or vias 22 in the substrate.

By utilizing an array of conductive; through holes, each of the IC interconnect pads 14 may now be routed to a corresponding solder pad 23 on the bottom of the substrate 16. The solder pads are typical of those found in surface mount or leadless applications, that is, they are flat pads that are substantially planar or flush with the surface of the substrate. In so doing, the lines and spaces required for the array of solder pads 23 are much larger than those that might be required for the IC device since the entire bottom surface of the substrate 16 might now be used. For example, spaces between the interconnect pads on an IC are typically 0.1 mm. By interconnecting the IC to a substrate in this manner, the spacings between the solder pads on the bottom of the substrate may be around 0.7 mm, allowing much greater latitude in the fabrication of the mother or main circuit board. This also allows one to more easily solder the IC package to the main circuit board using soldering processes that have greater latitude and lower cost.

The IC 10 is attached to the circuit carrying substrate 16 with the active surface 12 of the IC facing the upper surface of the substrate. Interconnection of the IC to the substrate is provided by means of conductive bumps 26 between the interconnect pads 14 on the IC and the bonding pads 18 on the substrate. These bumps are typically made from solder or they may also be gold alloy or other materials made by thermo-compression bonding, conductive epoxies, or conductive elastomers. In the preferred embodiment, solder is used and the device is attached to the substrate by means of the control-collapse-chip-connection (C4). This type of connection is well known to those skilled in the art and has been utilized to achieve high-density circuitry. Typically, in order to realize high yields and reliability in making a C4 connection, a cleanroom environment must be utilized. Therefore, the C4 process is most suitably employed early in the packaging process where the environment can be controlled. It should be appreciated that the chip carrier, in accordance with the present invention, once completed, does not require a cleanroom environment in order to be attached to a main circuit board because the C4 connection is made at the component level and the circuit board assembly connection is performed using the array of solder pads 23 that have much larger lines and spaces.

An organic coupling agent 28 is applied in the gap between the IC and the substrate. The coupling agent may be, for example, an adhesive such as an epoxy that is applied as a liquid and cured to a solid form, or it might be a softer material such as a silicone. One example of a suitable coupling agent is Hysol P4510, an epoxy from the Dexter Corporation of Industry, Calif. The organic coupling agent 28 serves to provide additional mechanical bonding between the device and the substrate, and also serves to environmentally protect the active surface of the device and the electrical interconnections. The organic coupling agent typically covers the entire gap between the device and the substrate but may only cover selected portions of the active surface, if desired.

Referring now to FIG. 2, it can be seen that the IC 10 lies over some of the conductive through holes 22 in the substrate. Each of these through holes 22 connects to a solder pad 23 on the bottom side of the substrate 16. The underfill material or coupling agent 28 fills the gap between the IC 10 and the substrate 16. The interconnect pads 14 of the IC are connected to bonding pads 18 by C4 solder bumps. In addition, the entire IC and substantially all of the top side of the substrate are covered by an encapsulating material 30. Typical encapsulant materials are epoxy or silicone "glob-top" polymeric encapsulants. Note that the encapsulating material 30 does not cover the vertical edges of the substrate or the bottom side of the substrate. The encapsulant 30 serves to further protect the IC 10 from environmental and mechanical stresses. In addition, it provides a means to rigidize the entire package. Since the encapsulant covers the entire top side of the package and typically as close to the edge of the package as possible at a thickness equal to or slightly higher than the die height, it provides sufficient counterforces to prevent the substrate 16 from bowing, twisting, or warping. In order to create a package with minimum thickness, a very thin substrate is chosen. As the substrate becomes thinner, problems with warping and twisting could become magnified because the substrate is now move flexible and fragile. As the number of I/O on the package increases, it becomes more difficult to create a high-yield, reliable interconnection between every single pad on the package and those on the main circuit board. Any amount of warp or camber in the substrate degrades the soldering yield and adversely impacts the assembly cost. By covering the entire top side of the substrate with the encapsulant material 30, the flatness and integrity of the package is assured. This creates a package that provides high-yield solder assembly.

In the preferred embodiment, the length and width of the substrate 16 is substantially greater than the length and width of the IC 10. This is because in high I/O die applications, the substrate grows substantially larger than the die in order to accommodate all of the widely spaced solder pads 23 on the bottom side of the substrate. However, since the substrate 16 has now been rigidized by the encapsulant material 30, handling of the package is no longer a problem because the flatness has been assured. The assembled package may now be electrically tested with conventional testing equipment without having to resort to expensive and complex equipment to accommodate the camber and warp experienced with prior art packages. Since the carrier is tested at the package level, the testing regime can be more thorough than that incorporated at the wafer level.

The encapsulated package may now be placed onto a printed circuit board by any number of interconnection schemes. For example, the package may be attached to the circuit board by solder joints as in the C5 process (controlled-collapse-chip-carrier-connection). Or, it may be attached using elastomer interconnects or hot-melt adhesive interconnects. In the case of the C5 connections, solder balls 27 are bumped on the bottom of the substrate 16. When the chip carrier package is placed on the main circuit board, the solder balls are reflowed, providing electrical and mechanical contact between the package and the circuit board (not shown).

A package created in accordance with this invention now provides numerous advantages, amongst which are: a package with significantly reduced height, a package that may be easily tested prior to assembly to the circuit board, a package that does not require cleanroom environments, a package that assures flatness of the substrate, a package that provides high-yield soldering, and a package that does not warp or bow during processing. The present invention satisfies a long-felt need for an improved integrated circuit chip carrier that is smaller in size, more reliable, lower cost, easier to manufacture, and electrically testable. It will be apparent from the foregoing that while particular forms of the invention have been illustrated and described, various modifications can be made without departing from the spirit and scope of the invention. The examples shown in the drawing figures, while illustrative, are not meant to be considered limiting and other confirmations of the present invention may be envisioned to fall within the scope of the invention. Accordingly, it is not intended that the invention be limited except as by the appended claims.

What is claimed is:

1. An integrated circuit package, comprising:

an integrated circuit chip having interconnection pads disposed on an active surface;

an organic substrate having two opposed sides, a first side having a circuitry pattern comprising bonding pads substantially corresponding to the integrated circuit chip interconnection pads and circuit traces coupled to the bonding pads, and a second side having a plurality of solder pads that are electrically connected to the bonding pads by plated through holes, most of the plated through holes located at a distance away from the corresponding bonding pads, the minimum spacing between the plurality of solder pads being greater than the minimum spacing between the integrated circuit chip bonding pads, at least some of the plated through holes being disposed in an area under the integrated circuit chip, and the substrate being substantially larger than the integrated circuit chip;

means for electrically and mechanically coupling the integrated circuit chip to the circuitry pattern, comprising bumps of electrically conducting material between the interconnection pads of the integrated circuit chip and the circuitry pattern;

an organic coupling agent disposed between the integrated circuit chip and the substrate, coveting at least a portion of the active surface; and a glob top encapsulant covering the integrated circuit chip and substantially all of the first side of the substrate.

2. The integrated circuit package of claim 1, wherein the substrate comprises an organic resin reinforced with aramid.

3. The integrated circuit package of claim 1, wherein the length and width of the organic substrate are each substantially greater than the length and width of the integrated circuit chip.

4. The integrated circuit package of claim 1, wherein the bumps of electrically conducting material comprise solder.

5. The integrated circuit package of claim 1, further comprising solder balls on the plurality of solder pads.

6. The semiconductor device package of claim 1, wherein the integrated circuit chip is connected to a circuitry pattern on the second side of the circuit carrying substrate by means of an unplated hole in the substrate that contains a solder bump connected to the circuitry pattern and extending through the hole and beyond the plane of the opposite side of the substrate.

7. An integrated circuit package, comprising:

a integrated circuit chip having interconnection pads disposed on a perimeter of an active surface;

a printed circuit board having two opposed sides, a first side having a circuitry pattern comprising solder pads corresponding to the integrated circuit chip interconnection pads and a second side having an array of solder lands, the spacing between the individual solder lands being greater than the spacing between the individual chip interconnection pads, each solder land electrically connected to a solder pad by means of a plated hole through the printed circuit board, each plated hole offset from and located a distance away from the corresponding solder pad a portion of the conductive holes disposed within an area defined by the solder pads;

means for electrically and mechanically coupling the integrated circuit chip to the printed circuit board, comprising solder bumps between the chip interconnection pads and the solder pads, the chip mounted with the active surface facing the first side of the printed circuit board;

an epoxy resin disposed between the chip and the printed circuit board, covering at least a portion of the active surface; and a glob top encapsulant covering the integrated circuit chip and substantially all of the first side of the printed circuit board.

8. The integrated circuit package of claim 7, further comprising a solder ball on on each solder land.

* * * * *